United States Patent
Chang et al.

(10) Patent No.: US 9,007,149 B2
(45) Date of Patent: Apr. 14, 2015

(54) COMMON MODE FILTER WITH MULTI SPIRAL LAYER STRUCTURE AND METHOD OF MANUFACTURING THE SAME

(75) Inventors: Yu Chia Chang, Taichung (TW); Chi Long Lin, Hsinchu County (TW); Cheng Yi Wang, New Taipei (TW); Shin Min Tai, Taoyuan County (TW)

(73) Assignee: Inpaq Technology Co., Ltd., Miaoli (TW)

( * ) Notice: Subject to any disclaimer, the term of this patent is extended or adjusted under 35 U.S.C. 154(b) by 356 days.

(21) Appl. No.: 13/572,378

(22) Filed: Aug. 10, 2012

(65) Prior Publication Data

US 2013/0076456 A1 Mar. 28, 2013

(30) Foreign Application Priority Data

Sep. 23, 2011 (TW) .............................. 100134276 A

(51) Int. Cl.
| | |
|---|---|
| *H03H 7/09* | (2006.01) |
| *H01F 17/00* | (2006.01) |
| *H03H 7/42* | (2006.01) |
| *H01P 11/00* | (2006.01) |
| *H03H 1/00* | (2006.01) |

(52) U.S. Cl.
CPC ........... *H01F 17/0013* (2013.01); *H03H 7/427* (2013.01); *H03H 7/09* (2013.01); *H01P 11/003* (2013.01); *H03H 2001/0085* (2013.01); *H03H 2001/0092* (2013.01); *H01F 2017/0066* (2013.01)

(58) Field of Classification Search
CPC . H03H 7/427; H03H 2001/0085; H03H 7/09; H01F 17/0013; H01P 11/003

USPC ................................ 333/12, 181, 185; 29/829
See application file for complete search history.

(56) References Cited

U.S. PATENT DOCUMENTS 3,705,365 A * 12/1972 Szabo et al. ..................... 333/12
6,917,274 B2 * 7/2005 Hong et al. ..................... 336/200

(Continued)

FOREIGN PATENT DOCUMENTS

| JP | 05-266411 | 10/1993 |
|---|---|---|
| JP | 06-020839 | 1/1994 |

(Continued)

OTHER PUBLICATIONS

Office Action dated Oct. 29, 2013 from Japan counterpart application 2011-269803 and its cited references JP2002-373810, JP2006-286934, JP2010-080550, JP2000-173824, JP2010-177380, JP2009-238912, JP05-266411, JP06-020839, and JP2000-260621.
English translation of the Office Action dated Oct. 29, 2013 from Japan counterpart application 2011-269803.

(Continued)

*Primary Examiner* — Benny Lee
*Assistant Examiner* — Rakesh Patel
(74) *Attorney, Agent, or Firm* — WPAT, P.C.; Anthony King; Kay Yang

(57) ABSTRACT

A common mode filter with a multi spiral layer structure includes a first coil, a second coil, a third coil connected in series with the first coil, a fourth coil connected in series with the second coil, a first material layer and a second material layer. The second coil is disposed between the first and third coils, and the third coil is disposed between the second and fourth coils. At least one of the first and second material layers comprises magnetic material. The first, second, third, and fourth coils are disposed between the first and second material layers.

20 Claims, 14 Drawing Sheets

(56) References Cited

U.S. PATENT DOCUMENTS

| | | | |
|---|---|---|---|
| 7,145,427 | B2 | 12/2006 | Yoshida et al. |
| 7,375,609 | B2 * | 5/2008 | Suzuki et al. ............ 336/200 |
| 2011/0285477 | A1 * | 11/2011 | Nakagawa et al. ......... 333/185 |

FOREIGN PATENT DOCUMENTS

| | | |
|---|---|---|
| JP | 2000-173824 | 6/2000 |
| JP | 2000-260621 | 9/2000 |
| JP | 2002-373810 | 12/2002 |
| JP | 2006-286934 | 10/2006 |
| JP | 2009-238912 | 10/2009 |
| JP | 2010-080550 | 4/2010 |
| JP | 2010-177380 | 8/2010 |

OTHER PUBLICATIONS

English translation of cited references JP2002-373810, JP2006-286934, JP2010-080550, JP2000-173824, JP2010-177380, JP2009-238912, JP05-266411, JP06-020839, and JP2000-260621.

Office Action dated Nov. 15, 2013 from Taiwan counterpart application 100134276.

English translation of the Office Action dated Nov. 15, 2013 from Taiwan counterpart application 100134276.

English translation of JP2002-373810, JP2006-286934, JP2010-080550, JP2000-173824, JP2010-177380, JP2009-238912, JP05-266411, JP06-020839, and JP2000-260621, respectively with dates Dec. 26, 2002; Oct. 19, 2006; Apr. 8, 2010; Jun. 23, 2000; Aug. 12, 2010; Oct. 15, 2009; Oct. 15, 1993; Jan. 28, 1994; Sep. 22, 2000.

English translation of JP2000173824, Jun. 23, 2000.

* cited by examiner

COMMON MODE FILTER WITH MULTI SPIRAL LAYER STRUCTURE AND METHOD OF MANUFACTURING THE SAME

CROSS-REFERENCE TO RELATED APPLICATION

The present application is based on, and claims priority from, Taiwan Patent Application Serial Number 100134276, filed on Sep. 23, 2011, the disclosure of which is hereby incorporated by reference herein in its entirety.

BACKGROUND OF THE INVENTION

1. Technical Field

The present invention relates to a common mode filter and a method of manufacturing the same, and more particularly relates to a multilayer common mode filter and a method of manufacturing the same.

2. Background

Common mode noise describes the type of noise that is conducted on all lines in the same direction. To suppress common mode noise, common mode filters or chokes can be installed on conducting lines where common mode noise is present. Traditionally, a common mode filter is comprised of components including an iron core and two coils wound around the iron core with the same winding number. When common mode current flows through the common mode filter, the two coils generate magnetic flux in the same direction such that the common mode filter exhibits high impedance and can suppress common mode noise.

To address the requirement of portable electronic apparatuses, thin film common mode filters have been developed. Japanese Patent Application No. JP2000173824 (A) discloses a thin film common mode filter. The thin film common mode filter has an upper magnetic layer, a lower magnetic layer, a plurality of insulative layers and a plurality of conductive patterns. The plurality of insulative layers and the plurality of conductive patterns are alternatively formed between the upper and lower magnetic layers.

Furthermore, U.S. Pat. No. 7,145,427 B2 discloses one type of thin film common mode filter, which includes two coil conductor layers, two lead-out electrode layers, a plurality of insulation layers, and two magnetic layers. Each coil conductor layer includes a coil, and the two lead-out electrode layers are used to extend the inner ends of the two coils to an edge of the thin film common mode filter for achieving an external electrical connection. The insulation layers are used for electrically insulating the coil conductor layers and the lead-out electrode layers. The coil conductor layers, the lead-out electrode layers, and the insulation layers are disposed between two magnetic layers.

Limited by dimensions, higher common mode impedance or different cut off frequencies cannot be easily obtained by modifying the coil structure of the above-mentioned thin film common mode filter. If the increase of the common mode impedance is achieved by adding to the number of windings, more space will be needed to install the thin film common mode filter, creating an adverse effect on the application of the thin-film common mode filter to portable electronic products.

SUMMARY

In one embodiment of the present invention, a common mode filter with a multi spiral layer structure comprises a first coil, a second coil, a third coil, a fourth coil, a first material layer, and a second material layer. The second coil is disposed between the first coil and the third coil. The third coil is disposed between the second coil and the fourth coil. The first coil is connected in series with the third coil. The second coil is connected in series with the fourth coil. The first, second, third, and fourth coils are disposed between the first and second material layers. At least one of the first and second material layers comprises magnetic material.

In one embodiment of the present invention, a method of manufacturing a common mode filter with a multi spiral layer structure comprises the steps of forming a magnetic material layer on an insulating substrate to obtain a heterogeneous substrate; forming a first coil comprising an inner end portion and an outer end portion on the heterogeneous substrate; forming a first insulating layer covering the first coil; forming a second coil on the first insulating layer; forming a second insulating layer covering the second coil; forming a first contact hole exposing either of the inner and outer end portions of the first coil; filling a first metal material in the first contact hole to form a first conductive pillar; forming a third coil comprising an inner end portion and an outer end portion on the second insulating layer, wherein either of the inner and outer end portions of the third coil is connected with the first conductive pillar; forming a third insulating layer covering the third coil; forming a second contact hole exposing either of the inner and outer end portions of the second coil; filling a second metal material in the second contact hole to form a second conductive pillar; forming a fourth coil comprising an inner end portion and an outer end portion on the third insulating layer, wherein either of the inner and outer end portions of the fourth coil is connected with the second conductive pillar; forming a fourth insulating layer covering the fourth coil; and disposing a material layer on the fourth insulating layer.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention are illustrated with the following description and upon reference to the accompanying drawings in which.

DETAILED DESCRIPTION

Figure 1:
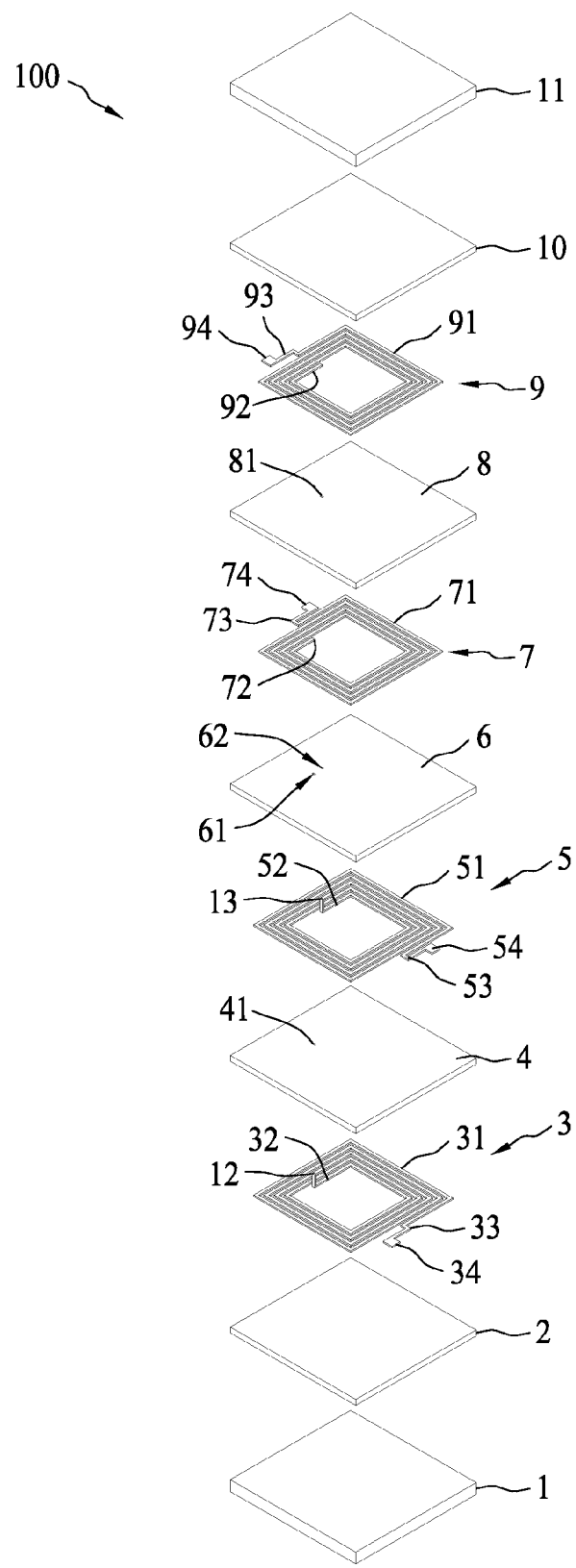
FIG. 1 is an exploded view schematically depicting a common mode filter according to one embodiment of the present invention.

In one embodiment of the present invention, a common mode filter comprises two coil groups each comprising a plurality of coil members connected in series with each other. Adjacent coils are separated by an insulating layer. The coil members of the two coil groups may be stacked in an alternating manner. Increasing the number of coils in the coil group can increase the common mode impedance of the common mode filter and easily change the differential mode cut off frequency to a desired value. Moreover, the increase of the number of coils in the coil group will not change the area required for the installation of the common mode filter. Furthermore, the common mode filter may further comprise two material layers, between which the coil members are disposed. At least one of the two material layers comprises magnetic material such that the common mode filter can provide better filtering performance FIG. 1 is an exploded view schematically depicting a common mode filter 100 according to one embodiment of the present invention. As shown in FIG. 1, the common mode filter 100 comprises a first material layer 1, a first coil layer 3 comprising a first coil 31, a second coil layer 5 comprising a second coil 51, a third coil layer 7 comprising a third coil 71, a fourth coil layer 9 comprising a fourth coil 91, and a second material layer 11, in which the first coil 31, the second coil 51, the third coil 71, and the fourth coil 91 are disposed between the first material layer 1 and the second material layer 11.

The first coil 31 is connected in series with the third coil 71, and the second coil 51 is connected in series with the fourth coil 91. The second coil 51 is disposed between the first coil 31 and the third coil 71. The third coil 71 is disposed between the second coil 51 and the fourth coil 91. The serially connected first and third coils 31 and 71 are magnetically coupled with the serially connected second and fourth coils 51 and 91 such that the serially connected first and third coils 31 and 71 and the serially connected second and fourth coils 51 and 91 may be used in common to eliminate common mode noise.

The first coil 31, the second coil 51, the third coil 71, and the fourth coil 91 may be in the form of a rectangular spiral as shown in FIG. 1. Alternatively, they may have other spiral shapes such as a shape of circular spiral.

In one embodiment, the first coil 31, the second coil 51, the third coil 71, and the fourth coil 91 may be substantially overlapped in the vertical direction.

In one embodiment, the first coil 31, the second coil 51, the third coil 71, and the fourth coil 91 may have the same number of coil windings.

In one embodiment, the first coil layer 3, the second coil layer 5, the third coil layer 7, and the fourth coil layer 9 may be formed using a plating process or a vacuum film formation process including a vapor deposition process or a sputtering process. The first coil layer 3, the second coil layer 5, the third coil layer 7, and the fourth coil layer 9 comprise a material made of silver, palladium, aluminum, chromium, nickel, titanium, gold, copper, platinum, or an alloy thereof.

In one embodiment, the first material layer 1 or the second material layer 11 comprises magnetic material. Specifically, the first material layer 1 is a magnetic material layer, and the second material layer 11 is a nonmagnetic material layer or an insulating layer. Alternatively, the first material layer 1 is a nonmagnetic material layer or an insulating layer, and the second material layer 11 is a magnetic material layer.

In one embodiment, at least one of the first material layer 1 and the second material layer 11 comprises magnetic material. In other words, the first material layer 1 is a magnetic material layer, and the second material layer 11 is a nonmagnetic material layer or an insulating layer; or the first material layer 1 is a nonmagnetic material layer or an insulating layer, and the second material layer 11 is a magnetic material layer; or the first material layer 1 and the second material layer 11 both are magnetic material layers.

In one embodiment, the afore-mentioned magnetic material layer comprises a magnetic plate member. The afore-mentioned nonmagnetic material layer comprises a nonmagnetic plate member. The afore-mentioned insulating layer comprises an insulating plate member.

In one embodiment, the magnetic material layer comprises nickel zinc ferrite or manganese-zinc ferrite.

In one embodiment, the nonmagnetic material layer comprises aluminum oxide, aluminum nitride, glass, or quartz.

In one embodiment, the magnetic material layer comprises polymer and magnetic powder. The polymer may comprise polyimide, epoxy, or benzocyclobutene. The magnetic powder may comprise nickel zinc ferrite or manganese-zinc ferrite.

Figure 13:
FIG. 13 is a side view schematically demonstrating a heterogeneous substrate according to one embodiment of the present invention.

Referring to FIG. 13, in one embodiment, at least one of the first material layer 1 and the second material layer 11 comprises a heterogeneous substrate. The heterogeneous substrate comprises an insulating material layer 111 and a magnetic material layer 112. The insulating substrate 111 and the magnetic material layer 112 may be co-fired together such that the insulating substrate 111 and the magnetic material layer 112 are joined by diffusion bonding. In another embodiment, the insulating substrate 111 and the magnetic material layer 112 can be bonded together by an adhesive. In yet another embodiment, the insulating substrate 111 and the magnetic material layer 112 can be separately formed using a thick film printing process.

Either the insulating substrate 111 or the magnetic material layer 112 can be the outside layer. In one embodiment, when the insulating substrate 111 is formed as the outside layer, the magnetic material layer 112 can be formed to match with the sizes of the coils. The magnetic material layer 112 can also be formed smaller than the insulating substrate 111, as shown in FIG. 13. In another embodiment, the area of the magnetic material layer 112 can be equivalent to that of the insulating substrate 111.

Figure 14:
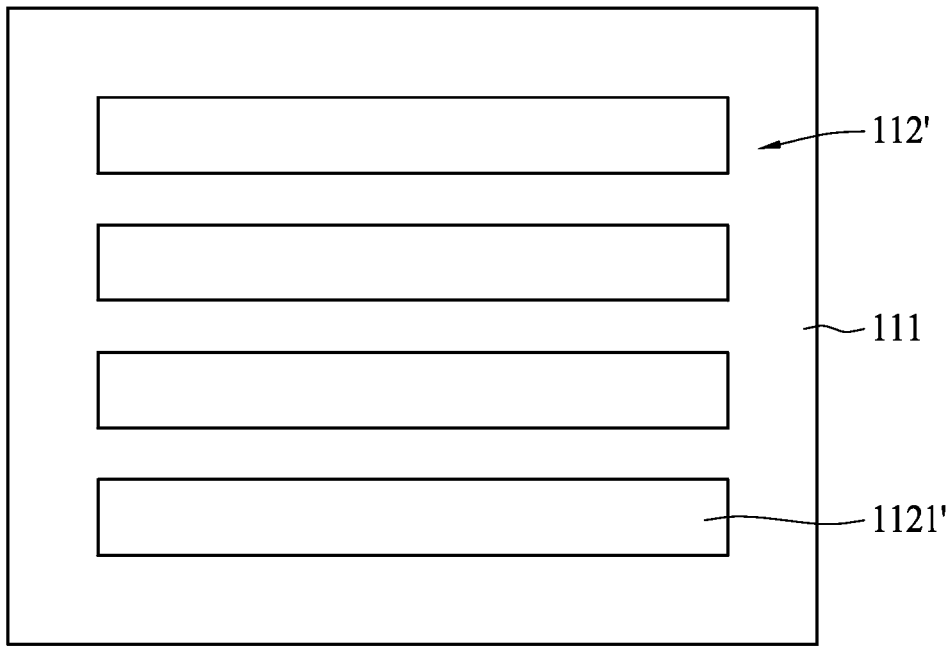
FIG. 14 is a top view schematically demonstrating a heterogeneous substrate according to another embodiment of the present invention.
Figure 15:
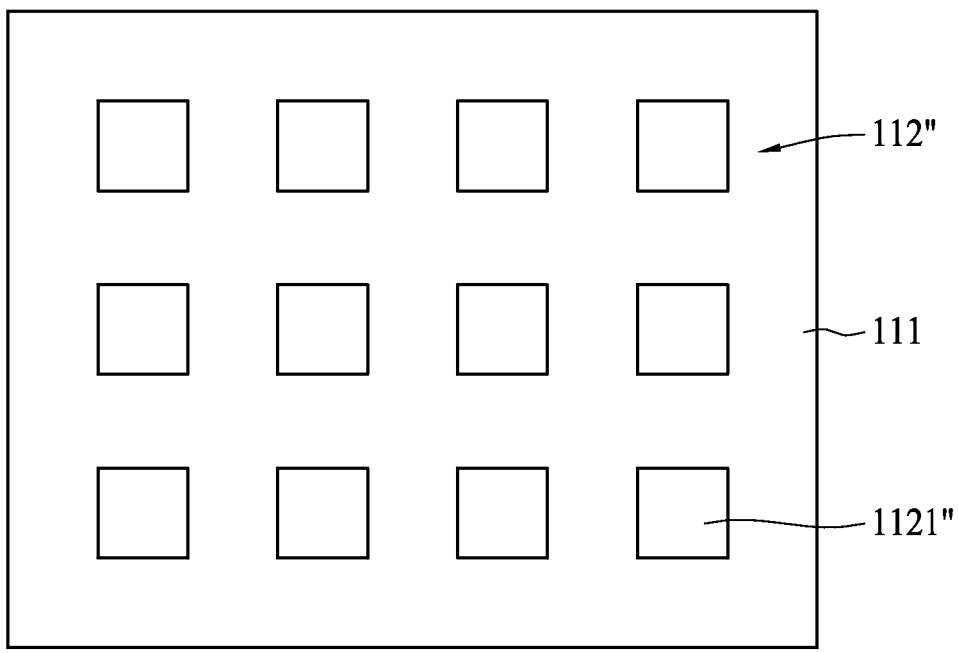
FIG. 15 is a top view schematically demonstrating a heterogeneous substrate according to yet another embodiment of the present invention.

Referring to FIGS. 14 and 15, the magnetic material layer 112' and 112" may comprise a plurality of independent magnetic material blocks 1121' or 1121". The independent magnetic material blocks 1121' or 1121" can be arranged in order on a major surface of the insulating substrate 111.

The inclusion of magnetic material in the first material layer 1 and/or the second material layer 11 can confine the magnetic field created by the common mode filter 100. As a result, the common mode filter 100 can provide better filtering performance Specifically, the common mode filter 100 may further comprise a lateral insulating layer 2, a first insulating layer 4, a second insulating layer 6, a third insulating layer 8, and a lateral insulating layer 10. The lateral insulating layer 2 is formed on the first material layer 1. The first coil layer 3 is formed on the lateral insulating layer 2. The first insulating layer 4 is formed between the first coil layer 3 and the second coil layer 5 for electrically separating the first coil layer 3 from the second coil layer 5. The second insulating layer 6 is formed between the second coil layer 5 and the third coil layer 7 for electrically separating the second coil layer 5 and the third coil layer 7. The third insulating layer 8 is formed between the third coil layer 7 and the fourth coil layer 9 for electrically separating the third coil layer 7 and the fourth coil layer 9. The lateral insulating layer 10 covers the fourth coil layer 9. The second material layer 11 is disposed on the lateral insulating layer 10.

Figure 2:
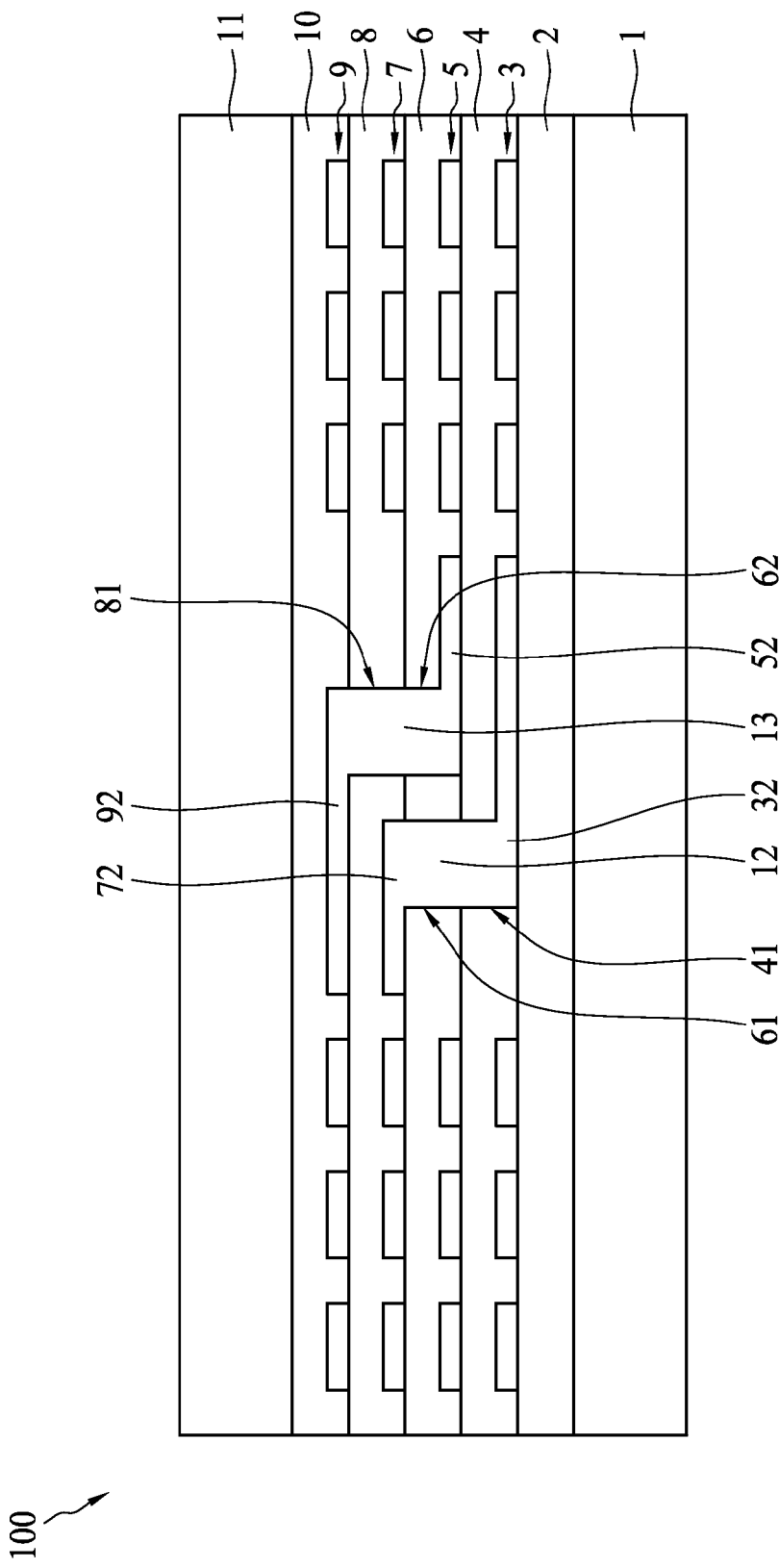
FIG. 2 is a cross-sectional view of the common mode filter of FIG. 1.

In particular, referring to FIGS. 1 and 2, the first coil 31 comprises an inner end portion 32, the third coil 71 comprises an inner end portion 72, the first insulating layer 4 comprises a contact hole 41, and the second insulating layer 6 comprises a contact hole 61, wherein the contact holes 41 and 61 are formed between the inner end portion 32 of the first coil 31 and the inner end portion 72 of the third coil 71 such that the first coil 31 can be electrically connected with the third coil 71 through the contact holes 41 and 61.

In addition, the common mode filter 100 further comprises a conductive pillar 12, which is formed through the contact holes 41 and 61 and configured to connect the inner end portion 32 of the first coil 31 and the inner end portion 72 of the third coil 71.

The second coil 51 comprises an inner end portion 52, the fourth coil 91 comprises an inner end portion 92, the second insulating layer 6 further comprises a contact hole 62, and the third insulating layer 8 comprises a contact hole 81, wherein the contact holes 62 and 81 are formed between the inner end portion 52 of the second coil 51 and the inner end portion 92 of the fourth coil 91 such that the inner end portion 52 of the second coil 51 can be electrically connected with the inner end portion 92 of the fourth coil 91 through the contact holes 62 and 81.

The common mode filter 100 may further comprise a conductive pillar 13, which is formed through the contact holes 62 and 81 and configured to connect the inner end portion 52 of the second coil 51 and the inner end portion 92 of the fourth coil 91.

In one embodiment, the conductive pillars 12 and 13 can be formed using a plating process or a vacuum film formation process including a vapor deposition process or a sputtering process. The conductive pillar 12 or 13 may be made of a material comprising silver, palladium, aluminum, chromium, nickel, titanium, gold, copper, platinum, or an alloy thereof.

In one embodiment, the lateral insulating layer 2, the first insulating layer 4, the second insulating layer 6, the third insulating layer 8, or the lateral insulating layer 10 may comprise polyimide, epoxy, or benzocyclobutene (BCB). The lateral insulating layer 2, the first insulating layer 4, the second insulating layer 6, the third insulating layer 8, or the lateral insulating layer 10 may be formed using a spin-coating process, a dipping process, a spraying process, a screen-printing process, or a thin film process.

The first coil 31, the second coil 51, the third coil 71, and the fourth coil 91 each comprises an outer end portion 33, 53, 73, or 93 connecting to a corresponding electrode 34, 54, 74, or 94 disposed adjacent to the periphery of the common mode filter 100. The first coil 31, the second coil 51, the third coil 71, or the fourth coil 91 makes an external connection through the respective electrode 34, 54, 74, or 94.

In one embodiment, the lateral insulating layer 2 may have a thickness in a range of from 1 micrometer to 20 micrometers.

In one embodiment, when the first material layer 1 is an insulating plate member, the first coil layer 3 can be directly formed on the first material layer 1. Under such a circumstance, a lateral insulating layer 2 is not necessarily formed on the first material layer 1.

In one embodiment, the common mode filter 100 may further comprise an adhesive layer, which is configured to bond the lateral insulating layer 10 and the second material layer 11.

Figure 3:
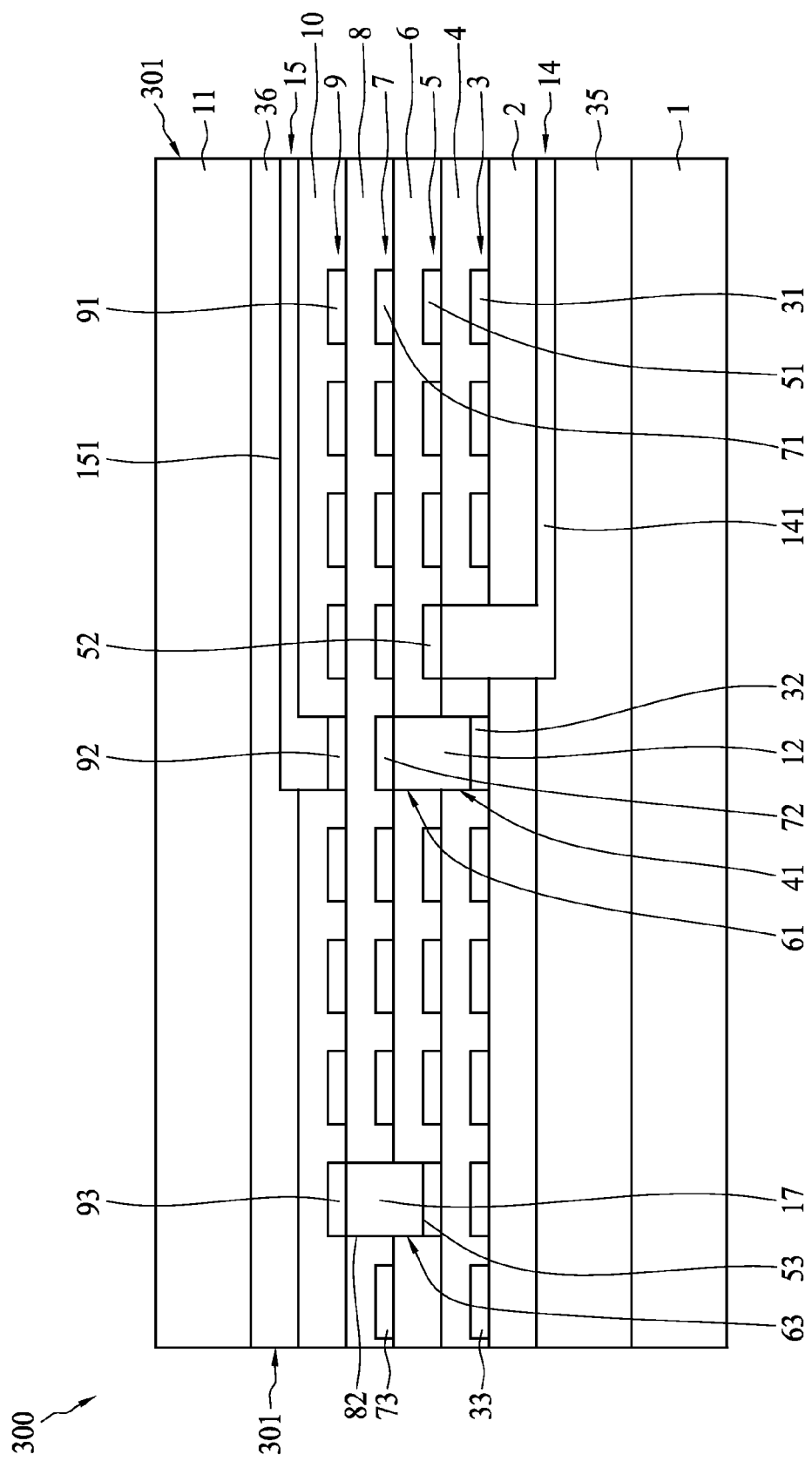
FIG. 3 is a cross-sectional view schematically illustrating a common mode filter according to another embodiment of the present invention.

FIG. 3 is a cross-sectional view schematically illustrating a common mode filter 300 according to another embodiment of the present invention. As shown in FIG. 3, the common mode filter 300 comprises a first material layer 1, an outer insulating layer 35, a first conductor layer 14, a lateral insulating layer 2, a first coil layer 3, a first insulating layer 4, a second coil layer 5, a second insulating layer 6, a third coil layer 7, a third insulating layer 8, a fourth coil layer 9, a lateral insulating layer 10, a second conductor layer 15, an outer insulating layer 36, and a second material layer 11.

The outer insulating layer 35 is formed on the first material layer 1. The first conductor layer 14 is formed on the outer insulating layer 35. The lateral insulating layer 2 covers the first conductor layer 14. The first coil layer 3 is formed on the lateral insulating layer 2. The first insulating layer 4 covers the first coil layer 3. The second coil layer 5 is formed on the first insulating layer 4. The second insulating layer 6 covers the second coil layer 5. The third coil layer 7 is formed on the second insulating layer 6. The third insulating layer 8 covers the third coil layer 7. The fourth coil layer 9 is formed on the third insulating layer 8. The lateral insulating layer 10 covers the fourth coil layer 9. The second conductor layer 15 is formed on the lateral insulating layer 10. The outer insulating layer 36 covers the second conductor layer 15. The second material layer 11 is disposed on the outer insulating layer 36.

In one embodiment, at least one of the first material layer 1 and the second material layer 11 comprises magnetic material.

In one embodiment, at least one of the first material layer 1 and the second material layer 11 comprises a heterogeneous substrate.

The outer insulating layer 35 or 36 may comprise a material comprising polyimide, epoxy, or benzocyclobutene, and can be formed by a method comprising a spin-coating process, a dipping process, a spraying process, a screen-printing process, or a thin film process.

The first coil layer 3 comprises a first coil 31 comprising an inner end portion 32 and an outer end portion 33. The second coil layer 5 comprises a second coil 51 comprising an inner end portion 52 and an outer end portion 53. The third coil layer 7 comprises a third coil 71 comprising an inner end portion 72 and an outer end portion 73. The fourth coil layer 9 comprises a fourth coil 91 comprising an inner end portion 92 and an outer end portion 93.

The first insulating layer 4 comprises a contact hole 41. The second insulating layer 6 comprises a contact hole 61. A conductive pillar 12 is formed through the contact holes 41 and 61, connecting the inner end portion 32 of the first coil 31 and the inner end portion 72 of the third coil 71 such that the first coil 31 is connected in series with the third coil 71. Similarly, the second insulating layer 6 further comprises a contact hole 63. The third insulating layer 8 comprises a contact hole 82. A conductive pillar 17 is formed through the contact holes 63 and 82, connecting the outer end portion 53 of the second coil 51 and the outer end portion 93 of the fourth coil 91 such that the second coil 51 is connected in series with the fourth coil 91.

The conductive pillar 12 or 17 can be formed using a plating process or a vacuum film formation process including a vapor deposition process or a sputtering process. The conductive pillar 12 or 17 may be made of a material comprising silver, palladium, aluminum, chromium, nickel, titanium, gold, copper, platinum, or an alloy thereof.

The first conductor layer 14 comprises a conductor 141. The conductor 141 comprises an end portion extending adjacent to a periphery 301 of the common mode filter 300 for making an external electrical connection and another end portion connected with the inner end portion 52 of the second coil 51 through the contact holes on the lateral insulating layer 2 and the first insulating layer 4. The second conductor layer 15 comprises a conductor 151. The conductor 151 comprises an end portion extending adjacent to a periphery 301 of the common mode filter 300 for making an external electrical connection and another end portion connecting with the inner end portion 92 of the fourth coil 91 through the contact hole on the lateral insulating layer 10. Furthermore, the outer end portion 33 of the first coil 31 extends adjacent to the periphery 301 of the common mode filter 300, connecting with a corresponding electrode adjacent to the periphery 301 of the common mode filter 300. The outer end portion 73 of the third coil 71 also extends adjacent to the periphery 301 of the common mode filter 300, connecting with a corresponding electrode adjacent to the periphery 301 of the common mode filter 300.

The first conductor layer 14, the first coil layer 3, the second coil layer 5, the third coil layer 7, the fourth coil layer 9, or the second conductor layer 15 may be formed of a material comprising silver, palladium, aluminum, chromium, nickel, titanium, gold, copper, platinum, or an alloy thereof. In addition, the first conductor layer 14, the first coil layer 3, the second coil layer 5, the third coil layer 7, the fourth coil layer 9, or the second conductor layer 15 may be formed using a plating process or a vacuum film formation process including a vapor deposition process or a sputtering process.

In addition to the connecting manner demonstrated in FIG. 3, the first coil 31, the second coil 51, the third coil 71, and the fourth coil 91 may be connected by other connecting manners. In another embodiment, the outer end portion 33 of the first coil 31 is connected with the outer end portion 73 of the third coil layer 7 such that the first coil 31 is connected in series with the third coil 71. The inner end portion 52 of the second coil 51 is connected with the inner end portion 92 of the fourth coil 91 such that the second coil 51 is connected in series with the fourth coil 91. Moreover, the inner end portion 32 of the first coil 31 and the inner end portion 72 of the third coil 71 are respectively connected with conductors for making an external electrical connection.

Figure 4:
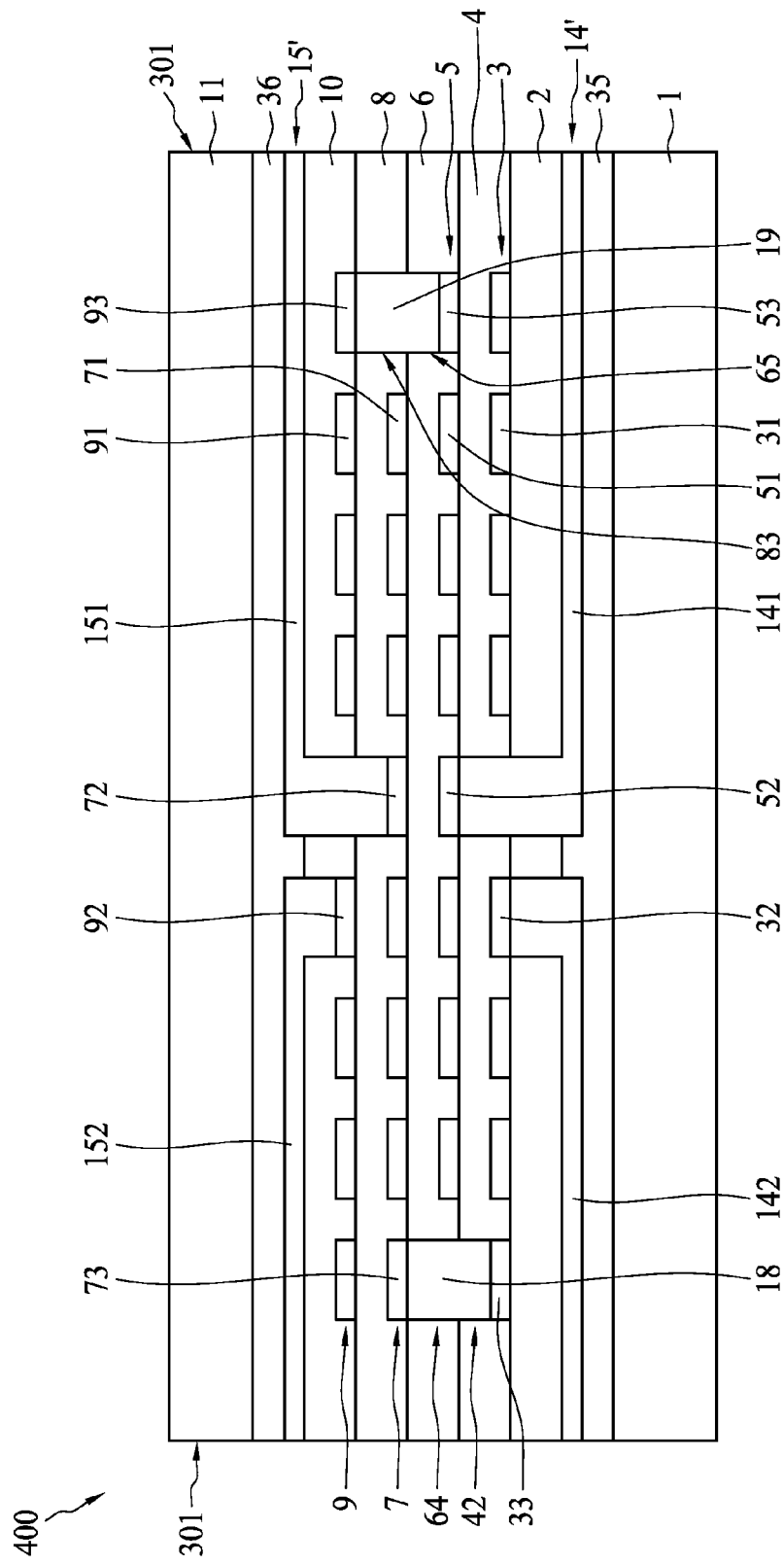
FIG. 4 is a cross-sectional view schematically demonstrating a common mode filter according to another embodiment of the present invention.

FIG. 4 is a cross-sectional view schematically demonstrating a common mode filter 400 according to another embodiment of the present invention. As shown in FIG. 4, the common mode filter 400 comprises a first material layer 1, an outer insulating layer 35, a first conductor layer 14', a lateral insulating layer 2, a first coil layer 3, a first insulating layer 4, a second coil layer 5, a second insulating layer 6, a third coil layer 7, a third insulating layer 8, a fourth coil layer 9, a lateral insulating layer 10, a second conductor layer 15', an outer insulating layer 36, and a second material layer 11.

The outer insulating layer 35 is formed on the first material layer 1. The first conductor layer 14' is formed on the outer insulating layer 35. The lateral insulating layer 2 covers the first conductor layer 14'. The first coil layer 3 is formed on the lateral insulating layer 2. The first insulating layer 4 covers the first coil layer 3. The second coil layer 5 is formed on the first insulating layer 4. The second insulating layer 6 covers the second coil layer 5. The third coil layer 7 is formed on the second insulating layer 6. The third insulating layer 8 covers the third coil layer 7. The fourth coil layer 9 is formed on the third insulating layer 8. The lateral insulating layer 10 covers the fourth coil layer 9. The second conductor layer 15' is formed on the lateral insulating layer 10. The outer insulating layer 36 covers the second conductor layer 15'. The second material layer 11 is disposed on the outer insulating layer 36.

The first coil layer 3 comprises a first coil 31 comprising an inner end portion 32 and an outer end portion 33. The second coil layer 5 comprises a second coil 51 comprising an inner end portion 52 and an outer end portion 53. The third coil layer 7 comprises a third coil 71 comprising an inner end portion 72 and an outer end portion 73. The fourth coil layer 9 comprises a fourth coil 91 comprising an inner end portion 92 and an outer end portion 93.

The first insulating layer 4 comprises a contact hole 42 and the second insulating layer 6 comprises a contact hole 64. A conductive pillar 18 is formed through the contact holes 42 and 64, connecting the outer end portion 33 of the first coil 31 and the outer end portion 73 of the third coil 71 such that the first coil 31 is connected in series with the third coil 71. The second insulating layer 6 further comprises a contact hole 65 and the third insulating layer 8 comprises a contact hole 83. A conductive pillar 19 is formed through the contact holes 65 and 83, connecting the outer end portion 53 of the second coil 51 and the outer end portion 93 of the fourth coil 91 such that the second coil 51 is connected in series with the fourth coil 91.

The conductive pillars 18 and 19 may be formed using a plating process or a vacuum film formation process including a vapor deposition process or a sputtering process. The conductive pillar 18 or 19 may be made of a material comprising silver, palladium, aluminum, chromium, nickel, titanium, gold, copper, platinum, or an alloy thereof.

The first conductor layer 14' comprises two conductors 141 and 142. The conductor 141 comprises one end portion extending to the periphery 301 of the common mode filter 400 for making an external electrical connection and another end portion connected with the inner end portion 52 of the second coil 51 through the contact holes on the lateral insulating layer 2 and the first insulating layer 4. The conductor 142 comprises an end portion extending adjacent to the periphery 301 of the common mode filter 400 for making an external electrical connection and another end portion connected with the inner end portion 32 of the first coil 31 through the contact hole on the lateral insulating layer 2. The second conductor layer 15' comprises two conductors 151 and 152. The conductor 151 comprises an end portion extending to the periphery 301 of the common mode filter 400 for making an external electrical connection and another end portion connected with the inner end portion 72 of the third coil 71 through the contact holes on the lateral insulating layer 10 and the third insulating layer 8. The conductor 152 comprises an end portion extending adjacent to the periphery 301 of the common mode filter 400 for making an external electrical connection and another end portion connected with the inner end portion 92 of the fourth coil 91 through the contact hole on the lateral insulating layer 10.

The first conductor layer 14', the first coil layer 3, the second coil layer 5, the third coil layer 7, the fourth coil layer 9, or the second conductor layer 15' can be made of a material comprising silver, palladium, aluminum, chromium, nickel, titanium, gold, copper, platinum, or an alloy thereof. Moreover, the first conductor layer 14', the first coil layer 3, the second coil layer 5, the third coil layer 7, the fourth coil layer 9, or the second conductor layer 15' can be formed using a plating process or a vacuum film formation process including a vapor deposition process or a sputtering process.

In one embodiment, at least one of the first material layer 1 and the second material layer 11 comprises magnetic material.

In one embodiment, at least one of the first material layer 1 and the second material layer 11 comprises a heterogeneous substrate.

Figure 5:
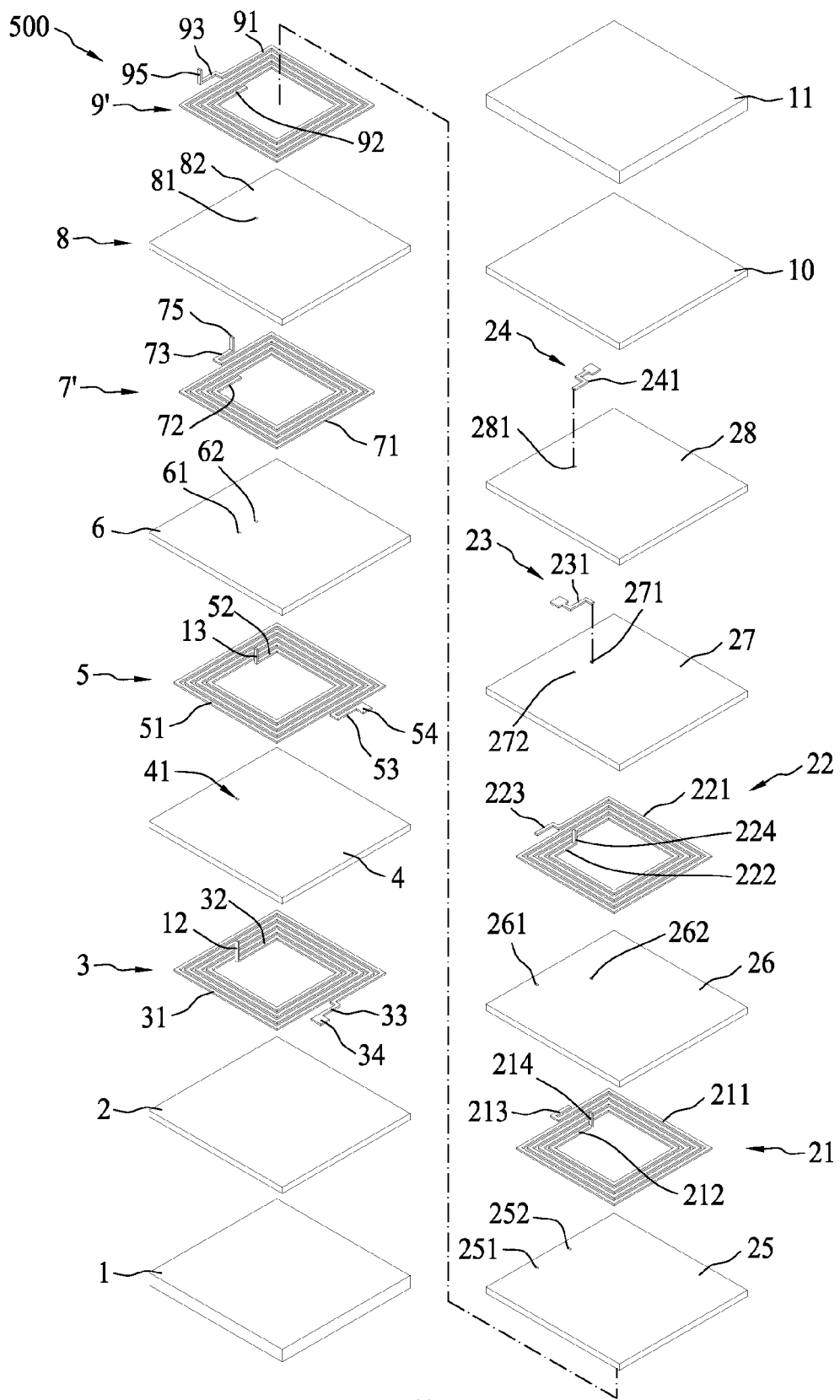
FIG. 5 is an exploded view schematically depicting a common mode filter according to another embodiment of the present invention.

FIG. 5 is a cross-sectional view schematically demonstrating a common mode filter 500 according to another embodiment of the present invention. Referring to FIG. 5, the common mode filter 500 comprises a first material layer 1, a first coil layer 3, a second coil layer 5, a third coil layer 7', a fourth coil layer 9', a fifth coil layer 21, a sixth coil layer 22, a conductor layer 23, a conductor layer 24, and a second material layer 11. The first coil layer 3 comprises a first coil 31. The second coil layer 5 comprises a second coil 51. The third coil layer 7' comprises a third coil 71. The fourth coil layer 9' comprises a fourth coil 91. The fifth coil layer 21 comprises a fifth coil 211. The sixth coil layer 22 comprises a sixth coil 221. The first coil layer 3, the second coil layer 5, the third coil layer 7', the fourth coil layer 9', the fifth coil layer 21, and the sixth coil layer 22 are formed in a stacking manner, wherein the first coil 31, the third coil 71 and the fifth coil 211 are connected in series, and the second coil 51, the fourth coil 91 and the sixth coil 221 are connected in a series.

Specifically, the lateral insulating layer 2 is formed on the first material layer 1. The first coil layer 3 is formed on the lateral insulating layer 2. The first insulating layer 4 electrically insulates the first coil layer 3 from the second coil layer 5. The second insulating layer 6 electrically insulates the second coil layer 5 from the third coil layer 7'. The third insulating layer 8 electrically insulates the third coil layer 7' from the fourth coil layer 9'. The fourth insulating layer 25 electrically insulates the fourth coil layer 9' from the fifth coil layer 21. The fifth insulating layer 26 electrically insulates the fifth coil layer 21 from the sixth coil layer 22. The sixth insulating layer 27 electrically insulates the sixth coil layer 22 from the conductor layer 23. The seventh insulating layer 28 insulates the conductor layer 23 from the conductor layer 24. The lateral insulating layer 10 covers the conductor layer 24. The second material layer 11 is disposed on the conductor layer 24.

A conductive pillar 12 is formed through the contact hole 41 of the first insulating layer 4 and the contact hole 61 of the second insulating layer 6, connecting the inner end portion 32 of the first coil 31 and the inner end portion 72 of the third coil 71. The outer end portion 33 of the first coil 31 is connected with an electrode 34.

A conductive pillar 13 is formed through the contact hole 62 of the second insulating layer 6 and the contact hole 81 of the third insulating layer 8, connecting the inner end portion 52 of the second coil 51 and the inner end portion 92 of the fourth coil 91. The outer end portion 53 of the second coil 51 is connected with an electrode 54.

A conductive pillar 75 is formed through the contact hole 82 on the third insulating layer 8 and the contact hole 252 on the fourth insulating layer 25, connecting the outer end portion 73 of the third coil 71 and the outer end portion 213 of the fifth coil 211.

A conductive pillar 95 is formed through the contact hole 251 on the fourth insulating layer 25 and the contact hole 261 on the fifth insulating layer 26, connecting the outer end portion 93 of the fourth coil 91 and the outer end portion 223 of the sixth coil 221.

A conductive pillar 214 is formed through the contact hole 262 on the fifth insulating layer 26 and the contact hole 271 on the sixth insulating layer 27, connecting the inner end portion 212 of the fifth coil 211 and one end portion of the conductor 231 of the conductor layer 23. Another end portion of the conductor 231 is connected with an electrode.

A conductive pillar 224 is formed through the contact hole 272 on the sixth insulating layer 27 and the contact hole 281 on the seventh insulating layer 28, connecting the inner end portion 222 of the sixth coil 221 and one end portion of the conductor 241 of the conductor layer 24. Another end portion of the conductor 241 is connected with an electrode.

The first coil layer 3, the second coil layer 5, the third coil layer 7', the fourth coil layer 9', the fifth coil layer 21, the sixth coil layer 22, the conductor layer 23, or the conductor layer 24 may be made of a material comprising silver, palladium, aluminum, chromium, nickel, titanium, gold, copper, platinum, or an alloy thereof, and can be formed using a plating process or a vacuum film formation process including a vapor deposition process or a sputtering process.

The conductive pillar 12, 13, 75, 95, 214, or 224 may be made of a material comprising silver, palladium, aluminum, chromium, nickel, titanium, gold, copper, platinum, or an alloy thereof, and can be formed using a plating process or a vacuum film formation process including a vapor deposition process or a sputtering process.

The lateral insulating layer 2, the first insulating layer 4, the second insulating layer 6, the third insulating layer 8, the lateral insulating layer 10, the fourth insulating layer 25, the fifth insulating layer 26, the sixth insulating layer 27, or the seventh insulating layer 28 may be made of a material comprising polyimide, epoxy, or benzocyclobutene, and can be formed using a spin-coating process, a dipping process, a spraying process, a screen-printing process, or a thin film process.

In one embodiment, at least one of the first material layer 1 and the second material layer 11 comprises magnetic material.

In one embodiment, at least one of the first material layer 1 and the second material layer 11 comprises a heterogeneous substrate.

Figure 6:
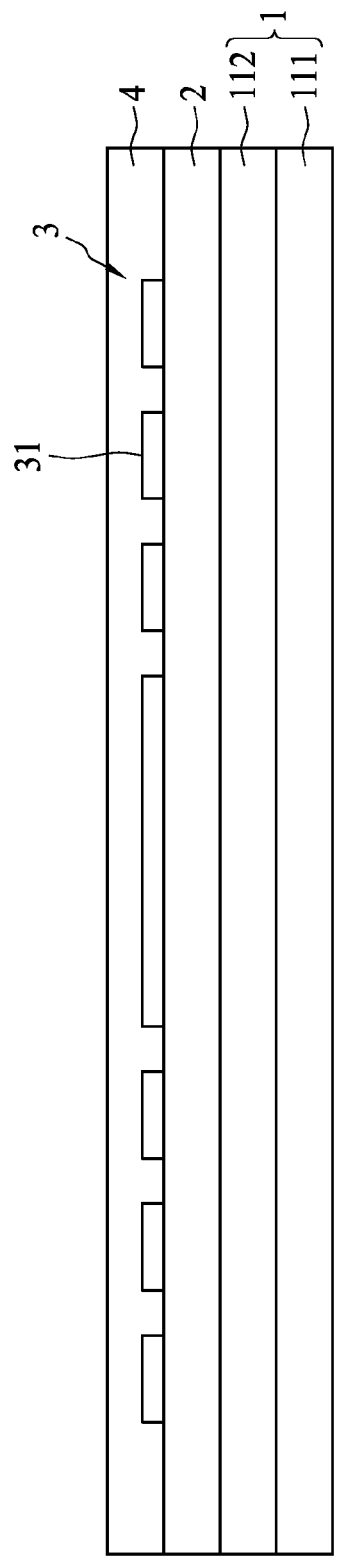
FIGS. 6 through 10 are cross-sectional views schematically depicting the steps of the method of manufacturing a common mode filter according to one embodiment of the present invention.

FIGS. 6 through 10 are cross-sectional views schematically depicting the steps of the method of manufacturing a common mode filter 100 according to one embodiment of the present invention. As shown in FIG. 6, a magnetic material layer 112 is formed on an insulating substrate 111 to obtain a first material layer (a heterogeneous substrate) 1. The insulating substrate 111 and the magnetic material layer 112 can be co-fired to join together or bonded together using an adhesive. The insulating substrate 111 and the magnetic material layer 112 can be separately formed using a thick film printing process. In one embodiment, the magnetic material layer 112 may comprise nickel zinc ferrite or manganese-zinc ferrite. In one embodiment, the magnetic material layer 112 comprises polymer material and magnetic powder. The polymer may comprise polyimide, epoxy, or benzocyclobutene. The magnetic powder may comprise nickel zinc ferrite or manganese-zinc ferrite. In one embodiment, the insulating substrate 111 may comprise aluminum oxide, aluminum nitride, glass, or quartz.

Thereafter, a lateral insulating layer 2 is formed on a first material layer 1. The lateral insulating layer 2 may comprise a material comprising polyimide, epoxy, or benzocyclobutene. The lateral insulating layer 2 can be formed using a spin-coating process, a dipping process, a spraying process, a screen-printing process, or a thin film process.

Referring to FIGS. 1 and 6, a first coil layer 3 is formed on the lateral insulating layer 2. The first coil layer 3 comprises a first coil 31 and an electrode 34, as shown in FIG. 1, wherein an outer end portion 33 of the first coil 31 is connected with the electrode 34. The first coil layer 3 may comprise a material comprising metal such as silver, palladium, aluminum, chromium, nickel, titanium, gold, copper, platinum, or an alloy thereof. The material for forming the first coil layer 3 can be deposited using a plating process or a vacuum film formation process including a vapor deposition process or a sputtering process. The patterning of the first coil layer 3 can be performed by a lithography process.

In particular, the first coil 31 can be formed using a plating process. The plating process initially forms an electrode layer on the lateral insulating layer 2. The electrode layer can be formed using a sputtering or vapor deposition process. A chromium or titanium film can be formed under the electrode layer for facilitating the adhesion between the electrode layer and the lateral insulating layer 2. Next, a photoresist layer with a coil pattern is formed on the electrode layer by a lithography process. Thereafter, an electroplated layer is formed using an electroplating process. The photoresist layer is peeled off, the electrode layer is removed using an etch process, and finally, the first coil 31 can be obtained.

Furthermore, a first insulating layer 4 is formed, covering the first coil layer 3. The first insulating layer 4 may comprise polymer, which may comprises polyimide, epoxy, or benzocyclobutene. The first insulating layer 4 may be formed using a spin-coating process, a dipping process, a spraying process, a screen-printing process, or a thin film process.

Figure 7:
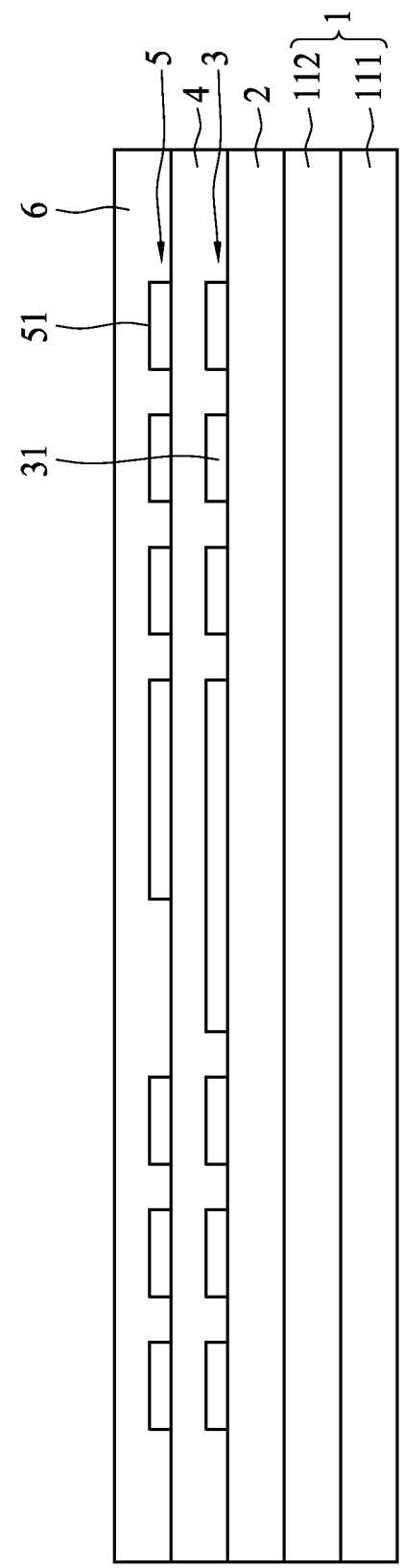

Referring to FIG. 1 and FIG. 7, a second coil layer 5 comprising a second coil 51 and an electrode 74 as shown in FIG. 1 is formed on the first insulating layer 4, wherein the outer end portion 53 of the second coil 51 is connected with the electrode 54 as shown in FIG. 1. The second coil layer 5 may be made of a material comprising metal such as silver, palladium, aluminum, chromium, nickel, titanium, gold, copper, platinum, or an alloy thereof. The material used to form the second coil layer 5 may be deposited by a plating process or a vacuum film formation process including a vapor deposition process or a sputtering process. The patterning of the second coil layer 5 may be performed using a lithography process. In one embodiment, the second coil 51 may be formed using the above-mentioned plating process.

Subsequently, a second insulating layer 6 is formed, covering the second coil layer 5. The second insulating layer 6 may comprise polymer comprising polyimide, epoxy, or benzocyclobutene. The second insulating layer 6 may be formed using a spin-coating process, a dipping process, a spraying process, a screen-printing process, or a thin film process.

Figure 8:
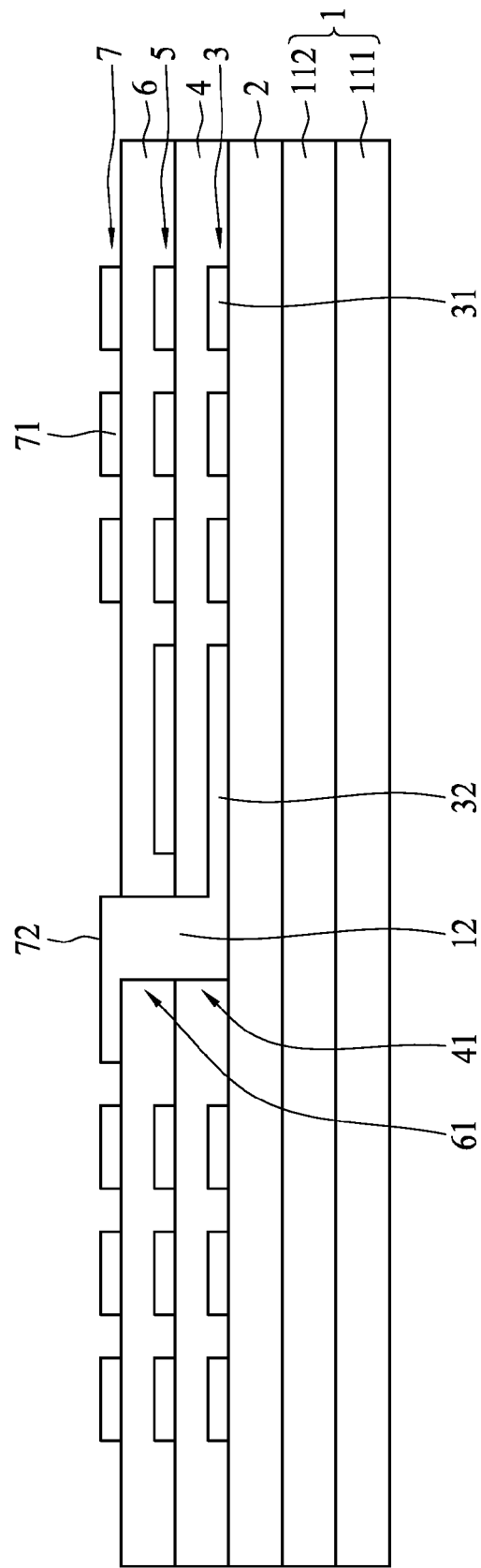

Referring to FIGS. 1 and 8, contact holes 41 and 61 are formed on the location of the inner end portion 32 of the first coil 31 using a lithography process to expose the inner end portion 32 of the first coil 31. Next, metal is deposited into the contact holes 41 and 61 using a plating process or a vacuum film formation process including a vapor deposition process or a sputtering process to form a conductive pillar 12.

Thereafter, a third coil layer 7 is formed on the second insulating layer 6. The third coil layer 7 comprises a third coil 71 and an electrode 74, wherein the outer end portion 73 of the third coil 71 is connected with the electrode 74 as shown in FIG. 1, while the inner end portion 72 of the third coil 71 is connected with the conductive pillar 12. The third coil layer 7 is formed of a material comprising metal such as silver, palladium, aluminum, chromium, nickel, titanium, gold, copper, platinum, or an alloy thereof. The material used to form the third coil layer 7 can be deposited using a plating process or a vacuum film formation process including a vapor deposition process or a sputtering process. The patterning of the third coil layer 7 may be performed using a lithography process. In one embodiment, the third coil 71 may be formed using the above-mentioned plating process.

Figure 9:
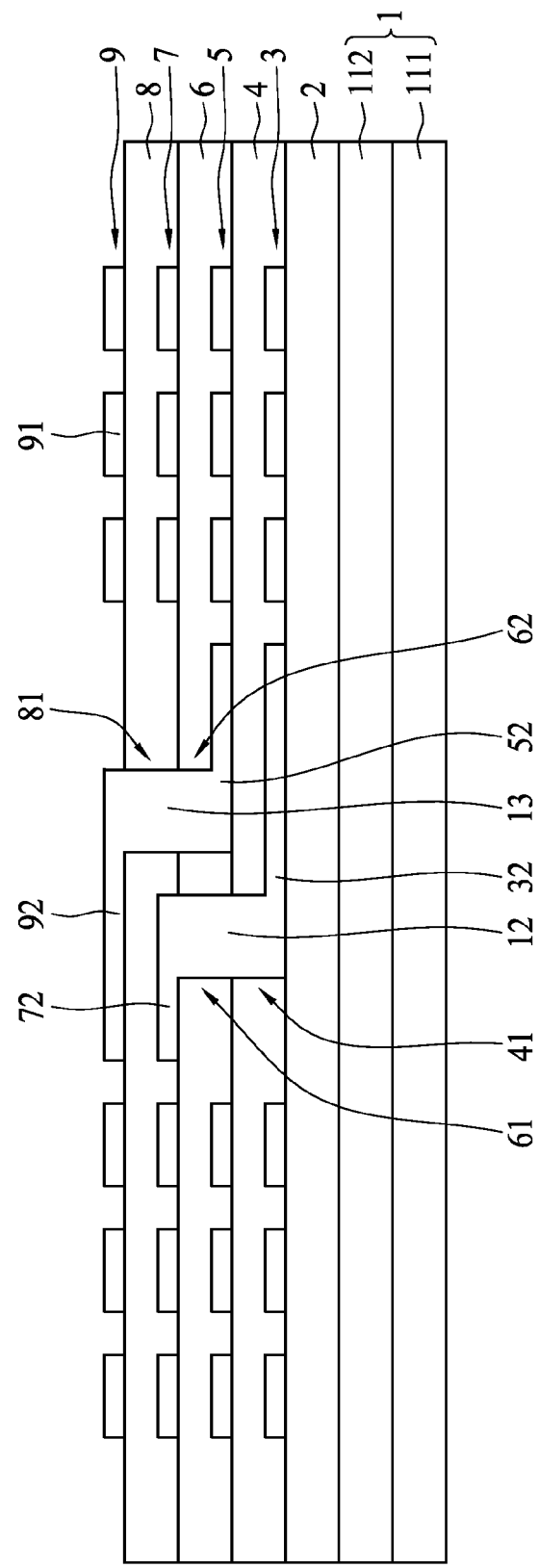

As shown in FIG. 9, a third insulating layer 8 is formed, covering the third coil layer 7. The third insulating layer 8 may comprise polymer comprising polyimide, epoxy, or benzocyclobutene. The third insulating layer 8 may be formed using a spin-coating process, a dipping process, a spraying process, a screen-printing process, or a thin film process.

Furthermore, contact holes 62 and 81 are formed using a lithography process to expose the inner end portion 52 of the second coil 51. Next, metal material is deposited into the contact holes 62 and 81 using a plating process or a vacuum film formation process including a vapor deposition process or a sputtering process to form a conductive pillar 13.

As illustrated in FIGS. 1 and 9, a fourth coil layer 9 comprising a fourth coil 91 and an electrode 94 is formed on the third insulating layer 8 as shown in FIG. 1, wherein the outer end portion 93 of the fourth coil 91 is connected with the electrode 94 as shown in FIG. 1, and the inner end portion 92 of the fourth coil 91 is connected with the conductive pillar 13. The fourth coil layer 9 is formed of a material comprising metal such as silver, palladium, aluminum, chromium, nickel, titanium, gold, copper, platinum, or an alloy thereof. The material used to form the fourth coil layer 9 may be deposited using a plating process or a vacuum film formation process including a vapor deposition process or a sputtering process. The patterning of the fourth coil layer 9 can be carried out using a lithography process. In one embodiment, the fourth coil 91 can be formed using the above-mentioned plating process.

Figure 10:
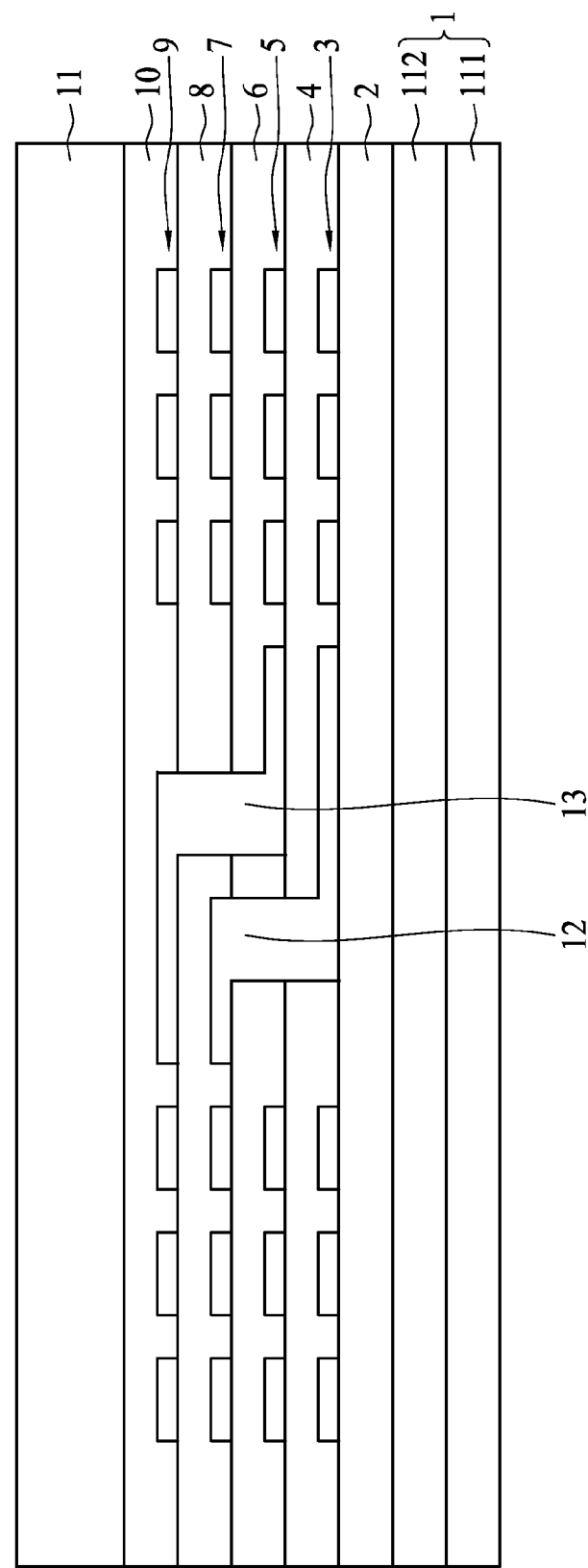

As shown in FIG. 10, a lateral insulating layer 10 is formed, covering the fourth coil layer 9. Next, a second material layer 11 is disposed on the fourth coil layer 9, and the manufacture of the common mode filter is completed. In one embodiment, the second material layer 11 is an insulating substrate, which may comprise polyimide, epoxy, or benzocyclobutene. In one embodiment, the second material layer 11 comprises a magnetic plate member.

The common mode filters in other embodiments of the present invention can be formed using the process demonstrated in FIGS. 6 through 10, and the details are not described to avoid redundant description.

Figure 11:
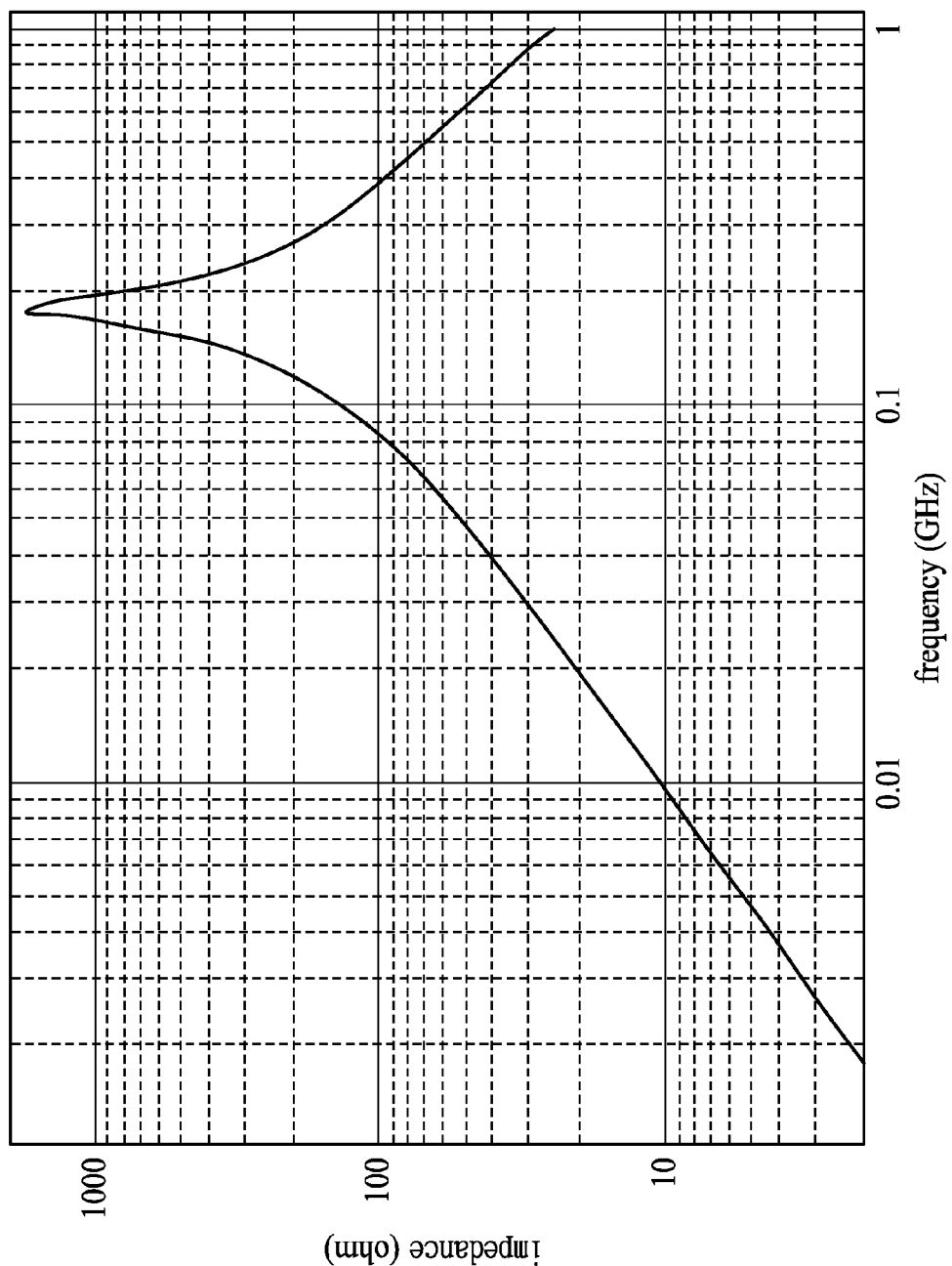
FIG. 11 is a diagram illustrating the relationship between the impedance and frequency of a common mode filter according to one embodiment of the present invention.
Figure 12:
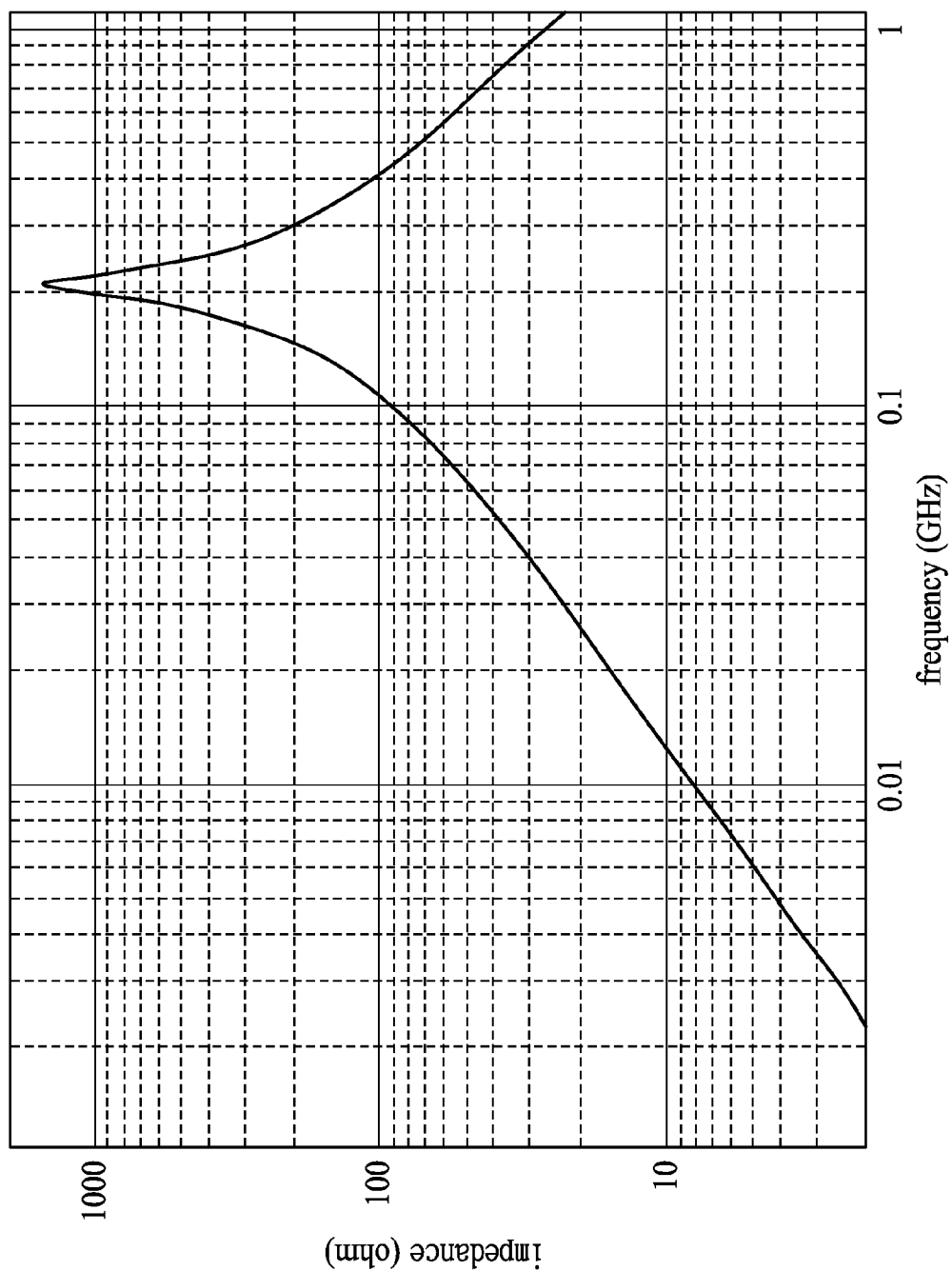
FIG. 12 is a diagram illustrating the relationship between the impedance and frequency of a current common mode filter.

FIG. 11 is a diagram illustrating the relationship between the impedance and frequency of a common mode filter according to one embodiment of the present invention. FIG. 12 is a diagram illustrating the relationship between the impedance and frequency of a conventional common mode filter. In comparison of the curves of FIG. 11 and FIG. 12, it can be found that the common mode filter of one embodiment of the present invention exhibits higher impedance, and has a wider rejection bandwidth at the same impedance level. Thus, the common mode filter with a multi spiral layer structure can have better performance compared to a conventional common mode filter.

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A common mode filter with a multi spiral layer structure, comprising:
    a first coil;
    a second coil;
    a third coil connected in series with the first coil, wherein the second coil is disposed between the first coil and the third coil;
    a fourth coil connected in series with the second coil, wherein the third coil is disposed between the second coil and the fourth coil;
    a first material layer and a second material layer, at least one of the first and second material layers comprising a magnetic material, wherein the first, second, third, and fourth coils are disposed between the first and second material layers; and
    wherein an inner end portion of the first coil is connected with an inner end portion of the third coil, and an outer end portion of the second coil is connected with an outer end portion of the fourth coil.

2. The common mode filter of claim 1, wherein one of the first and second material layers is a magnetic plate member and another of the first and second material layers is an insulating plate member.

3. The common mode filter of claim 1, wherein each of the first and second material layers is a magnetic plate member.

4. The common mode filter of claim 1, wherein one of the first and second material layers is a heterogeneous substrate, which comprises a layer of the magnetic material and an insulating substrate.

5. The common mode filter of claim 4, wherein the magnetic material layer and the insulating substrate are joined by diffusion bonding.

6. The common mode filter of claim 1, wherein an inner end portion of the second coil is connected with an inner end portion of the fourth coil.

7. The common mode filter of claim 6, further comprising:
    a first insulating layer configured to separate the first coil and the second coil, the first insulating layer comprising a first contact hole formed between the inner end portion of the first coil and the inner end portion of the third coil;
    a second insulating layer configured to separate the second coil and the third coil, the second insulating layer comprising a second contact hole and a third contact hole, wherein the second contact hole is formed between the inner end portion of the first coil and the inner end portion of the third coil, and the third contact hole is formed between the inner end portion of the second coil and the inner end portion of the fourth coil; and
    a third insulating layer configured to separate the third coil and the fourth coil, the third insulating layer comprising a fourth contact hole formed between the inner end portion of the second coil and the inner end portion of the fourth coil.

8. The common mode filter of claim 1, wherein respective outer end portions of the first, second, third, and fourth coils are adjacent to a periphery of the common mode filter.

9. The common mode filter of claim 1, further comprising a first conductor and a second conductor, wherein a first end portion of the first conductor connects to an inner end portion of the second coil, a second end portion of the first conductor is disposed adjacent to a periphery of the common mode filter; a first end portion of the second conductor connects to an inner end portion of the fourth coil, and a second end portion of the second conductor is disposed adjacent to the periphery of the common mode filter.

10. The common mode filter of claim 9, further comprising:
    a first insulating layer configured to separate the first coil and the second coil, the first insulating layer comprising a first contact hole and a second contact hole, wherein the first contact hole of the first insulating layer is formed between the inner end portion of the first coil and the inner end portion of the third coil, and the second contact hole of the first insulating layer is formed between the inner end portion of the second coil and the first end portion of the first conductor;
    a second insulating layer configured to separate the second coil and the third coil, the second insulating layer comprising a first contact hole and a second contact hole, wherein the first contact hole of the second insulating layer is formed between the inner end portion of the first coil and the inner end portion of the third coil, and the second contact hole of the second insulating layer is formed between the outer end portion of the second coil and the outer end portion of the fourth coil; and
    a third insulating layer configured to separate the third coil and the fourth coil, the third insulating layer comprising a contact hole formed between the outer end portion of the second coil and the outer end portion of the fourth coil.

11. The common mode filter of claim 1, wherein an outer end portion of the first coil is connected with an outer end portion of the third coil.

12. The common mode filter of claim 11, further comprising:
    a first conductor comprising an end portion connected with an inner end portion of the second coil; and
    a second conductor comprising an end portion connected with an inner end portion of the third coil.

13. The common mode filter of claim 12, further comprising:
   a first insulating layer configured to separate the first coil and the second coil, the first insulating layer comprising a first contact hole and a second contact hole, wherein the first contact hole of the first insulating layer is formed between the outer end portion of the first coil and the outer end portion of the third coil, and the second contact hole of the first insulating layer is formed between the inner end portion of the second coil and the end portion of the first conductor;
   a second insulating layer configured to separate the second coil and the third coil, the second insulating layer comprising a first contact hole and a second contact hole, wherein the first contact hole of the second insulating layer is formed between the outer end portion of the first coil and the outer end portion of the third coil, and the second contact hole of the second insulating layer is formed between the outer end portion of the second coil and the outer end portion of the fourth coil; and
   a third insulating layer configured to separate the third coil and the fourth coil, the third insulating layer comprising a first contact hole and a second contact hole, wherein the first contact hole of the third insulating layer is formed between the outer end portion of the second coil and the outer end portion of the fourth coil, and the second contact hole of the third insulating layer is formed between the inner end portion of the third coil and the end portion of the second conductor.

14. A method of manufacturing a common mode filter with a multi spiral layer structure, comprising the steps of:
   forming a magnetic material layer on an insulating substrate to obtain a heterogeneous substrate;
   forming a first coil comprising an inner end portion and an outer end portion on the heterogeneous substrate;
   forming a first insulating layer covering the first coil;
   forming a second coil comprising an inner end portion and an outer end portion on the first insulating layer;
   forming a second insulating layer covering the second coil;
   forming a first contact hole exposing either of the inner and outer end portions of the first coil;
   filling a first metal material in the first contact hole to form a first conductive pillar;
   forming a third coil comprising an inner end portion and an outer end portion on the second insulating layer, wherein either of the inner and outer end portions of the third coil is connected with the first conductive pillar;
   forming a third insulating layer covering the third coil;
   forming a second contact hole exposing either of the inner and outer end portions of the second coil;
   filling a second metal material in the second contact hole to form a second conductive pillar;
   forming a fourth coil comprising an inner end portion and an outer end portion on the third insulating layer, wherein either of the inner and outer end portions of the fourth coil is connected with the second conductive pillar;
   forming a fourth insulating layer covering the fourth coil;
   disposing a material layer on the fourth insulating layer; and
   wherein the inner end portion of the first coil is connected with the inner end portion of the third coil, and the outer end portion of the second coil is connected with the outer end portion of the fourth coil.

15. The method of claim 14, wherein one of the step of forming the first coil, the step of forming the second coil, the step of forming the third coil, and the step of forming the fourth coil is performed using a vapor deposition process, a sputtering process, or a plating process.

16. The method of claim 14, wherein the first insulating layer, the second insulating layer, the third insulating layer, the fourth insulating layer, or the material layer comprises polyimide, epoxy, or benzocyclobutene.

17. The method of claim 14, wherein the material layer comprises a magnetic substrate.

18. The method of claim 14, wherein the first, second, third, or fourth coil comprises silver, palladium, aluminum, chromium, nickel, titanium, gold, copper, platinum, or an alloy thereof.

19. The method of claim 14, wherein the first or second metal material comprises silver, palladium, aluminum, chromium, nickel, titanium, gold, copper, platinum, or an alloy thereof.

20. The method of claim 14, wherein one of the step of forming a first insulating layer, the step of forming a second insulating layer, the step of forming a third insulating layer, and the step of forming a fourth insulating layer is performed using a spin-coating process, a dipping process, a spraying process, a screen-printing process, or a thin film process.

* * * * *